US012610486B2

(12) United States Patent
Lu et al.

(10) Patent No.: US 12,610,486 B2
(45) Date of Patent: Apr. 21, 2026

(54) CASING DEVICE

(71) Applicant: Acer Incorporated, New Taipei City (TW)

(72) Inventors: Ching-Yi Lu, New Taipei City (TW); Ming-Cheng Wu, New Taipei City (TW); Yi-Heng Lee, New Taipei City (TW)

(73) Assignee: ACER INCORPORATED, New Taipei City (TW)

( * ) Notice: Subject to any disclaimer, the term of this patent is extended or adjusted under 35 U.S.C. 154(b) by 162 days.

(21) Appl. No.: 18/435,575

(22) Filed: Feb. 7, 2024

(65) Prior Publication Data

US 2024/0284623 A1 Aug. 22, 2024

(30) Foreign Application Priority Data

Feb. 21, 2023 (TW) ................................. 112106315

(51) Int. Cl.
*H05K 5/03* (2006.01)
*G06F 1/18* (2006.01)
*H05K 5/02* (2006.01)

(52) U.S. Cl.
CPC ............... *H05K 5/03* (2013.01); *G06F 1/181* (2013.01); *H05K 5/0217* (2013.01)

(58) Field of Classification Search
CPC ...... H05K 5/03; H05K 5/0217; H05K 5/0221; G06F 1/181
USPC ... 312/263, 319.1, 223.2, 265.5, 265.6, 216; 361/679.58, 679.57, 679.6, 724, 727, 726
See application file for complete search history.

(56) References Cited

U.S. PATENT DOCUMENTS

| | | | | |
|---|---|---|---|---|
| 5,823,644 A | | 10/1998 | Suh et al. | |
| 6,157,532 A | * | 12/2000 | Cook ...................... | G06F 1/181 |
| | | | | 312/265.2 |
| 6,356,436 B1 | * | 3/2002 | Buican .................... | G06F 1/181 |
| | | | | 312/263 |
| 6,932,447 B2 | * | 8/2005 | Chen ...................... | A47B 88/48 |
| | | | | 312/265.5 |
| 7,242,576 B2 | * | 7/2007 | Coster .................... | G06F 1/183 |
| | | | | 312/265.5 |
| 9,661,769 B2 | * | 5/2017 | Zepf .................... | H05K 9/0009 |
| 2005/0040740 A1 | * | 2/2005 | Yun ........................ | G06F 1/181 |
| | | | | 361/679.58 |

(Continued)

FOREIGN PATENT DOCUMENTS

| | | | | |
|---|---|---|---|---|
| CN | 1307443 A | * | 8/2001 | |
| CN | 109710035 A | * | 5/2019 | |

(Continued)

*Primary Examiner* — Janet M Wilkens
(74) *Attorney, Agent, or Firm* — Birch, Stewart, Kolasch & Birch, LLP

(57) ABSTRACT

A casing device is provided in this disclosure. The casing device comprises a casing body and a slide rail assembly. The casing body includes a side panel and a top bracket. The slide rail assembly is movably arranged on the casing body. The slide rail assembly includes a slide component and a slide rail. The slide component is fixed with the slide rail. When the slide rail assembly is in a first position, the side panel is fastened to the top bracket and the slide rail. When the slide rail assembly moves from the first position to a second position, the side panel is able to be detached from the top bracket and the slide rail.

9 Claims, 5 Drawing Sheets

(56)                    References Cited

U.S. PATENT DOCUMENTS

2008/0225475  A1*   9/2008   Zhang ...................... G06F 1/181
                                                    361/726
2009/0168341  A1*   7/2009   Zhang ...................... G06F 1/186
                                                    361/679.58
2011/0095662  A1*   4/2011   Wang ...................... G06F 1/181
                                                    312/223.1
2012/0262038  A1*   10/2012   Zeng ...................... G06F 1/181
                                                    312/223.2

FOREIGN PATENT DOCUMENTS

CN          218383798   U      1/2023
CN          116556781   A   *   8/2023   ........... E05B 65/025
KR          100475578   B1  *   3/2005   ............ G06F 1/181
TW           M297006   U      9/2006
TW          200837536   A      9/2008
WO     WO-2017217969  A1  *  12/2017   ............ G06F 1/181

* cited by examiner

CASING DEVICE

This application claims the benefit of Taiwan application Serial No. 112106315, filed Feb. 21, 2023, the subject matter of which is incorporated herein by reference.

TECHNICAL FIELD

The invention relates in general to a casing device, and more particularly to a casing device with a slide rail assembly.

BACKGROUND

Generally speaking, the side panel of a computer case needs to be fastened using screws. To complete the assembly task, a tool kit is needed, which is inconvenient to the user. Besides, the top cover of the computer case normally cannot be detached. If the user wants to detach elements from inside the computer case, the user can only detach the elements via the side, not the top, of the case.

Therefore, how to resolve the above problems has become an important direction to the personnel in the technology field of the present disclosure.

SUMMARY

The invention is directed to a casing device, in which the casing body is provided with a slide rail assembly movable between distinct positions, such that the user can toollessly assemble or detach the side panel of the casing body, not only saving labor but also providing more convenience.

According to one embodiment of the present invention, a casing device is provided. The casing device includes a casing body and a slide rail assembly. The casing body includes a side panel and a top bracket. The slide rail assembly is movably arranged on the casing body. The slide rail assembly includes a slide component and a slide rail. The slide component is fixed with the slide rail. When the slide rail assembly is in a first position, the side panel is fastened to the top bracket and the slide rail. When the slide rail assembly moves from the first position to a second position, the side panel is able to be detached from the top bracket and the slide rail.

The above and other aspects of the invention will become better understood with regard to the following detailed description of the preferred but non-limiting embodiment(s). The following description is made with reference to the accompanying drawings.

DETAILED DESCRIPTION

Detailed descriptions of each embodiment of the present invention are disclosed below with reference to accompanying drawings. Apart from the said detailed descriptions, any embodiments in which the present invention can be used as well as any substitutions, modifications or equivalent changes of the said embodiments are within the scope of the present invention, and the descriptions and definitions in the claims shall prevail. Specific details and embodiments are disclosed in the specification for anyone ordinary skilled in the art to comprehensively understand the present invention, not for limiting the present invention. Moreover, generally known procedures or elements are not disclosed to avoid adding unnecessary restrictions to the present invention. Unless otherwise specified, element designations common to different drawings can be regarded as corresponding elements. These drawings are for describing the connection relationship between the elements of the embodiments, and the dimension scales used in the accompanying drawings are not based on actual proportion of the elements.

Figure 1:
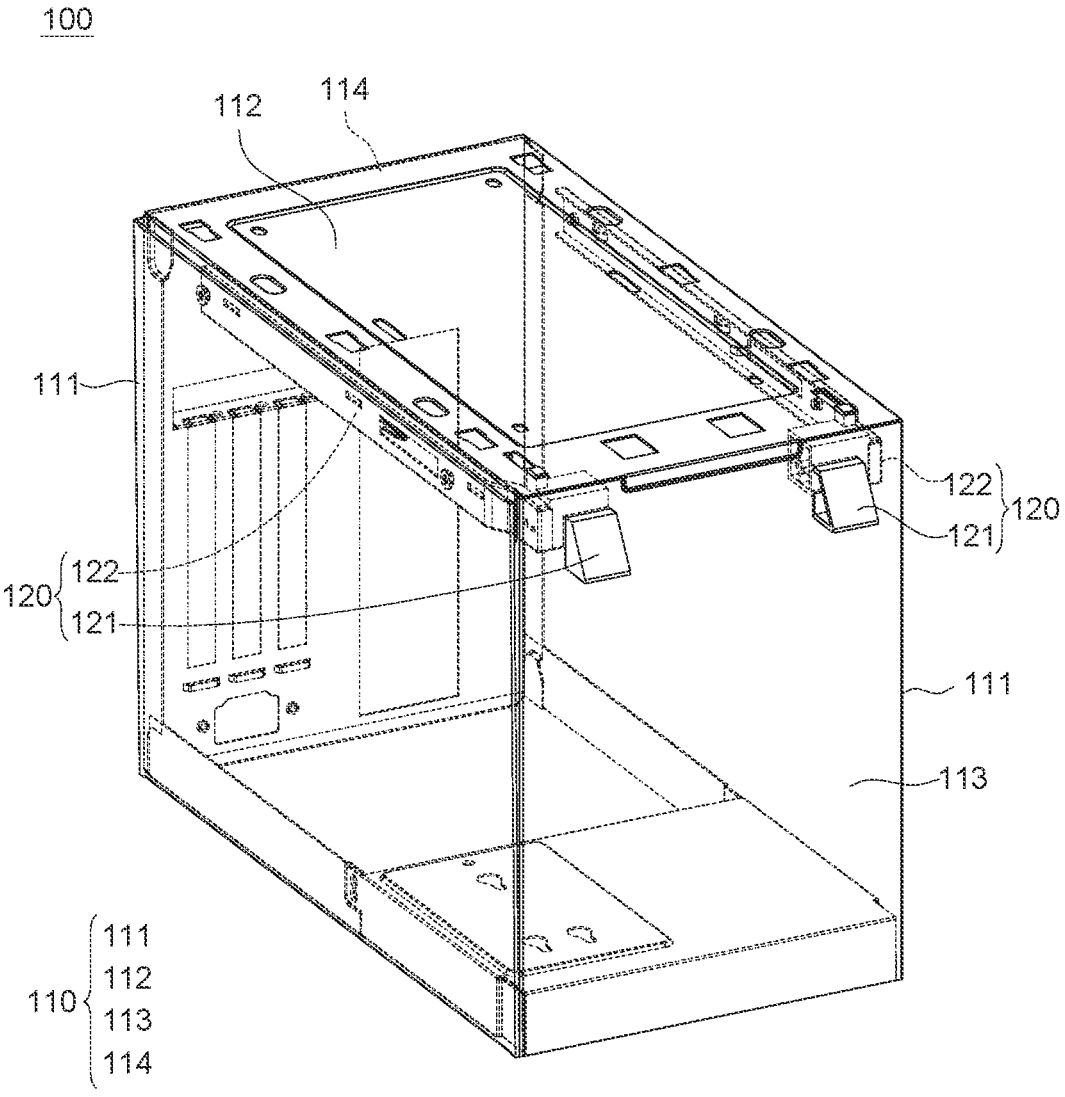
FIG. 1 is a schematic diagram of a casing device according to an embodiment of the present disclosure.

Referring to FIG. 1, a schematic diagram of a casing device 100 according to an embodiment of the present disclosure is shown. The casing device 100, such as a case for desktop computers, comprises a casing body 110 and a slide rail assembly 120. The slide rail assembly 120 is movably arranged on the casing body 110. The casing body 110 includes a side panel 111 and a top bracket 112. In the present embodiment, it is exemplified that the casing device 100 includes two opposite side panels 111, each having one slide rail assembly 120 arranged thereon. The top bracket 112 is arranged at the top of the casing device 100 and is positioned between the two side panels 111. Additionally, the casing body 110 further includes a front plate 113 and a back plate 114. The front plate 113 and the back plate 114 are arranged on two opposite sides of the top bracket 112 and are adjacent to the side panels 111.

Figure 2:
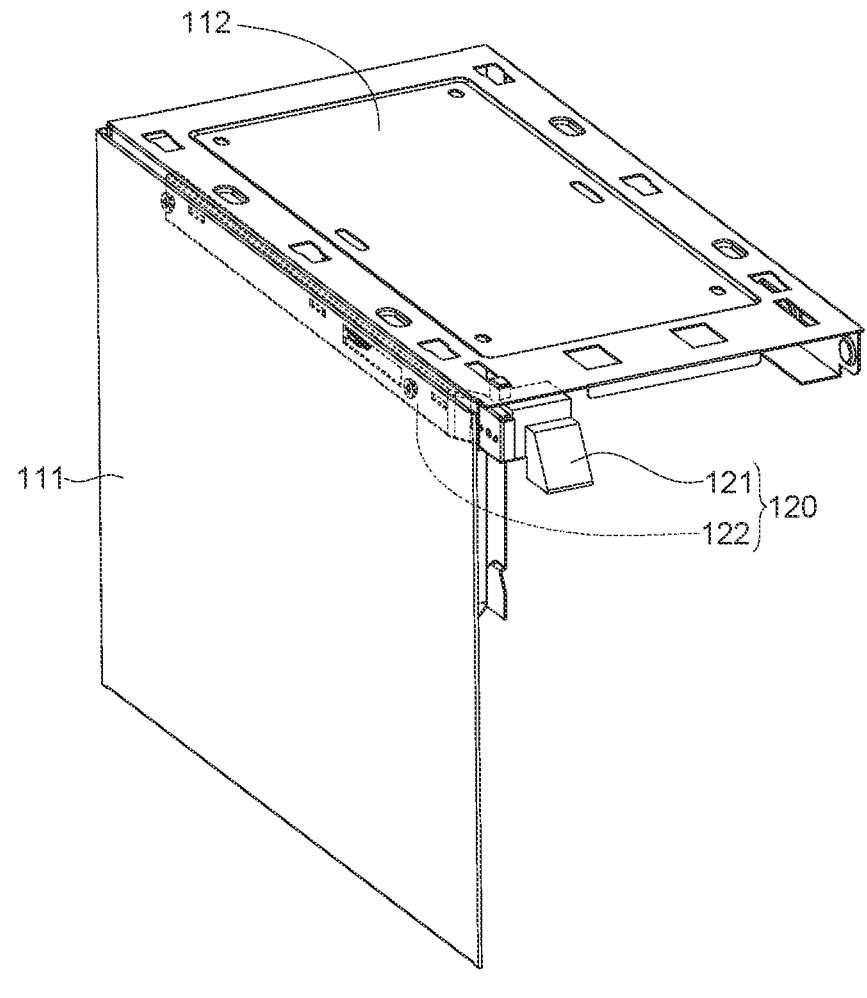
FIG. 2 is an assembly diagram of partial elements of a casing device according to an embodiment of the present disclosure.

Referring to FIG. 2, an assembly diagram of a side panel 111, a top bracket 112 and a slide rail assembly 120 of a casing device 100 is shown. To put it in greater details, the slide rail assembly 120 is movably arranged on the top bracket 112. The slide rail assembly 120 includes a slide component 121 and the slide rail 122, and the slide component 121 is fixed with the slide rail 122. Exemplarily but not restrictively, the slide component 121 may be locked on the slide rail 122 by using a screw element. As indicated in FIG. 1, the slide component 121 passes through the front plate 113 and is movably with respect to the front plate 113.

Figure 3A:
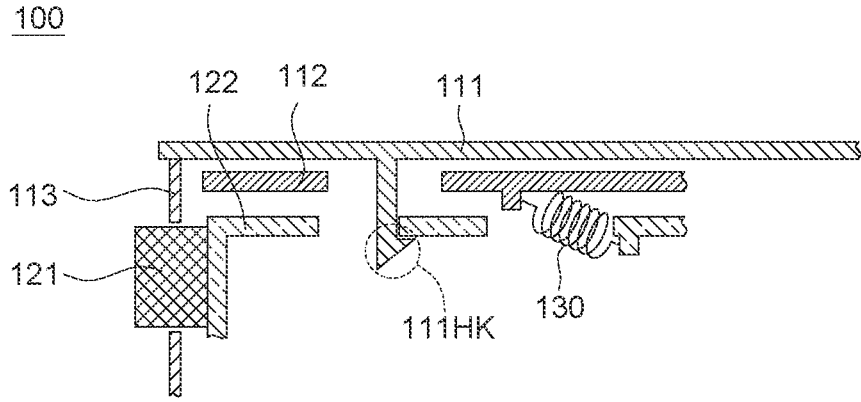
FIG. 3A to FIG. 3B are schematic diagrams of the actuation of a slide rail assembly of a casing device between a first position and a second position according to an embodiment of the present disclosure.
Figure 3B:
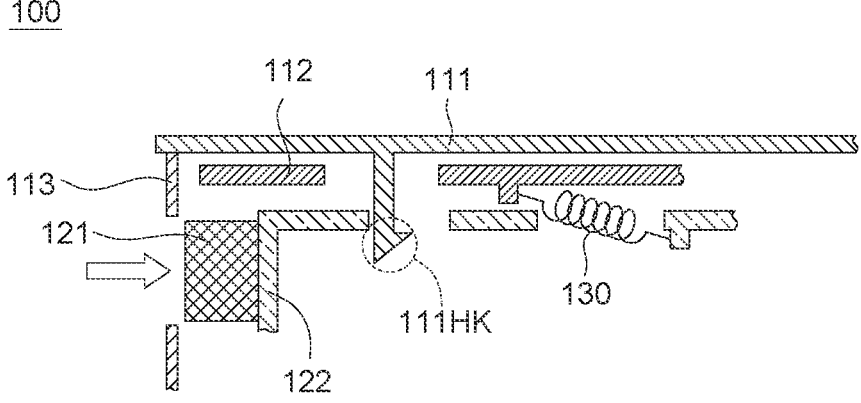

Referring to FIG. 3A to FIG. 3B, schematic diagrams of the actuation of a slide rail assembly 120 of a casing device 100 between two positions are shown. FIG. 3A is a schematic diagram showing that the slide rail assembly 120 in a first position. FIG. 3B is a schematic diagram showing that the slide rail assembly 120 is in a second position. Moreover, FIG. 3A to FIG. 3B are top views of the internal arrangement of the casing device 100. The arrangement from the exterior to the interior of the casing device 100 is the side panel 111, the top bracket 112, and then the slide rail assembly 120 in order. As indicated in FIG. 3A, it corresponds to the state, in which the slide component 121 is protruded outside the front plate 113 as shown in FIG. 1, the side panel 111 may be engaged with the top bracket 112 and the slide rail 122 when the slide rail assembly 120 is in the first position. To put it in greater details, the side panel 111 may be provided with a hook portion 111HK, and the hook portion 111HK passes through the top bracket 112 and the slide rail 122 to be engaged with the slide rail 122 when the slide rail assembly 120 is in the first position, such that the assembly of the side panel 111 is completed.

As indicated in FIG. 3B, an external force is applied on the slide component 121 and the slide component 121 moves from the front plate 113 towards the interior of the casing device 100 when the slide rail assembly 120 moves from the first position to the second position, such that the side panel 111 is able to be detached from the top bracket 112 and the slide rail 122. To put it in greater details, the slide component 121 may drive the slide rail 122 to move with respect to the top bracket 112 and the side panel 111 due to fixation with the slide rail 122 when the slide component 121 moves towards the interior or the casing device 100, such that the engagement between the hook portion 111HK and the slide rail 122 can be released and the side panel 111 can be detached from the top bracket 112 and the slide rail 122.

The casing device 100 further comprises an elastic element 130, such as an extension spring. As indicated in FIG. 3A to FIG. 3B, the elastic element 130 is connected between the slide rail 122 and the top bracket 112. The elastic element 130 provides an elastic force for returning the slide rail assembly 120 from the second position to the first position when the side panel 111 is detached from the top bracket 112 and the slide rail 122. To put it in greater details, the distance between two ends of the elastic element 130 respectively connected the slide rail 122 and the top bracket 112 is increased when the slide component 121 moves towards the interior of the casing device 100, such that the elastic element 130 bears an extension load and accumulates an elastic potential energy. After the fastening between the side panel 111 and the slide rail 122 is released, the elastic element 130 releases its elastic potential energy to provide a restoring force for moving the slide rail assembly 120 towards the exterior of the casing device 100, such that the slide component 121 can be returned to be protruded outside the front plate 113.

Figure 4:
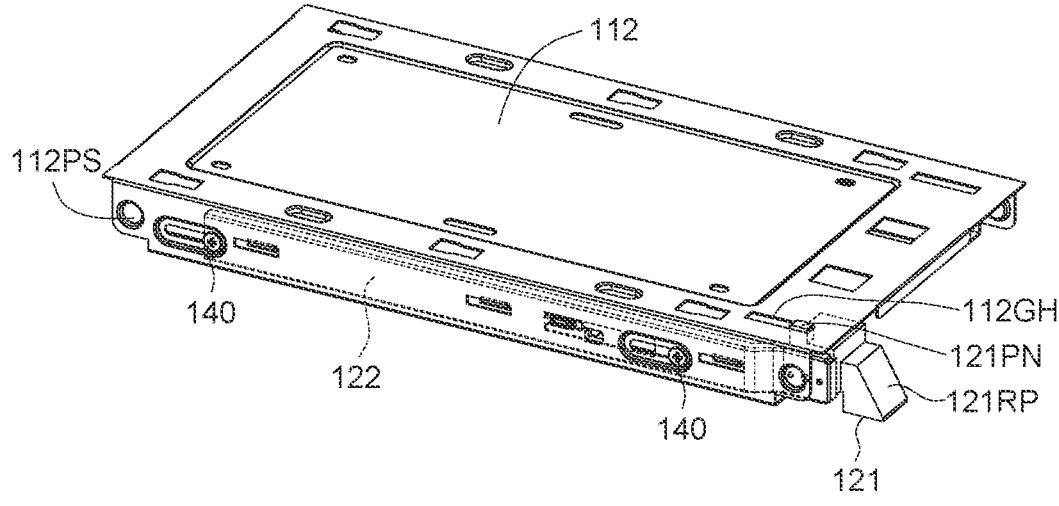
FIG. 4 is an assembly diagram of partial elements of a casing device according to an embodiment of the present disclosure.
Figure 5:
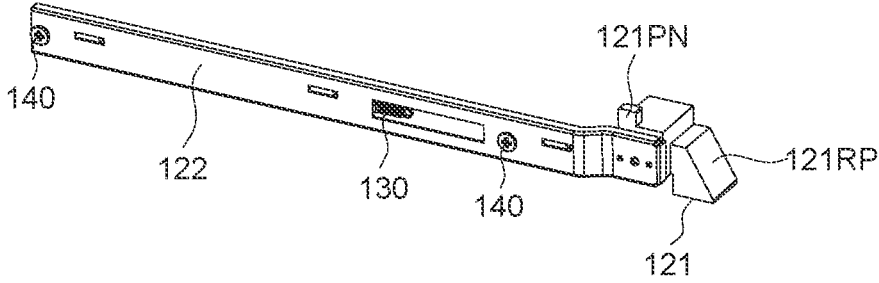
FIG. 5 is a schematic diagram of a slide rail assembly of a casing device according to an embodiment of the present disclosure.

Refer to FIG. 4 to FIG. 5. FIG. 4 is an assembly diagram of a top bracket 112 and a slide rail assembly 120 of a casing device 100. FIG. 5 is a schematic diagram of a slide rail assembly 120 of a casing device 100. The casing device 100 further includes a guide bolt 140, such as a bolt formed of an unthreaded section and a threaded section. As indicated in FIG. 4, the guide bolt 140 passes through the top bracket 112 and the slide rail 122 and is locked on the slide rail 122. Specifically, the unthreaded section of the guide bolt 140 passes through the top bracket 112, and the threaded section of the guide bolt 140 passes through the slide rail 122. The slide rail 122 and the guide bolt 140 are movable with respect to the top bracket 112 when the slide rail assembly 120 moves from the first position where the side panel 111 is fixed to the second position where the side panel 111 is detachable. That is, the guide bolt 140 may move with respect to the top bracket 112 along with the slide rail assembly 120. In the present embodiment, there are two guide bolts 140 arranged on one side of the casing device 100 and are respectively adjacent to the front plate 113 and the back plate 114 of the casing body 110, such that the slide rail assembly 120 can move more stably.

As indicated in FIG. 4 to FIG. 5, the slide component 121 may be provided with an inclined plane structure 121RP. The inclined plane structure 121RP may be exposed from the front plate 113 that is shown in FIG. 1. The inclined plane structure 121RP provides the slide component 121 with a position for bearing a longitudinal force. The longitudinal force may be an external force perpendicular to the structural extending direction of the slide rail 122 and may be triggered by a trigger component of another inclined plane structure corresponding to the inclined plane structure 121RP. The inclined plane structure 121RP converts the longitudinal force of said trigger component to a horizontal force parallel to the structural extending direction of the slide rail 122, such that the slide rail assembly 120 can move between the first position and the second position along the structural extending direction of the slide rail 122.

As indicated in FIG. 4, the top bracket 112 may be provided with a guide slot 112GH, and the slide component 121 may be provided with a protrusion 121PN. The protrusion 121PN may be exposed in the guide slot 112GH. The guide slot 112GH is able to limit the protrusion 121PN so as to guide the slide component 121 bearing a force to move along the structural extending direction of the slide rail 122. Besides, in an embodiment, the protrusion 121PN of the slide component 121 may be provided with a snap hook structure, through which the protrusion 121PN is engaged on one side of the guide slot 112GH to stabilize the assembly of the top bracket 112.

Figure 6:
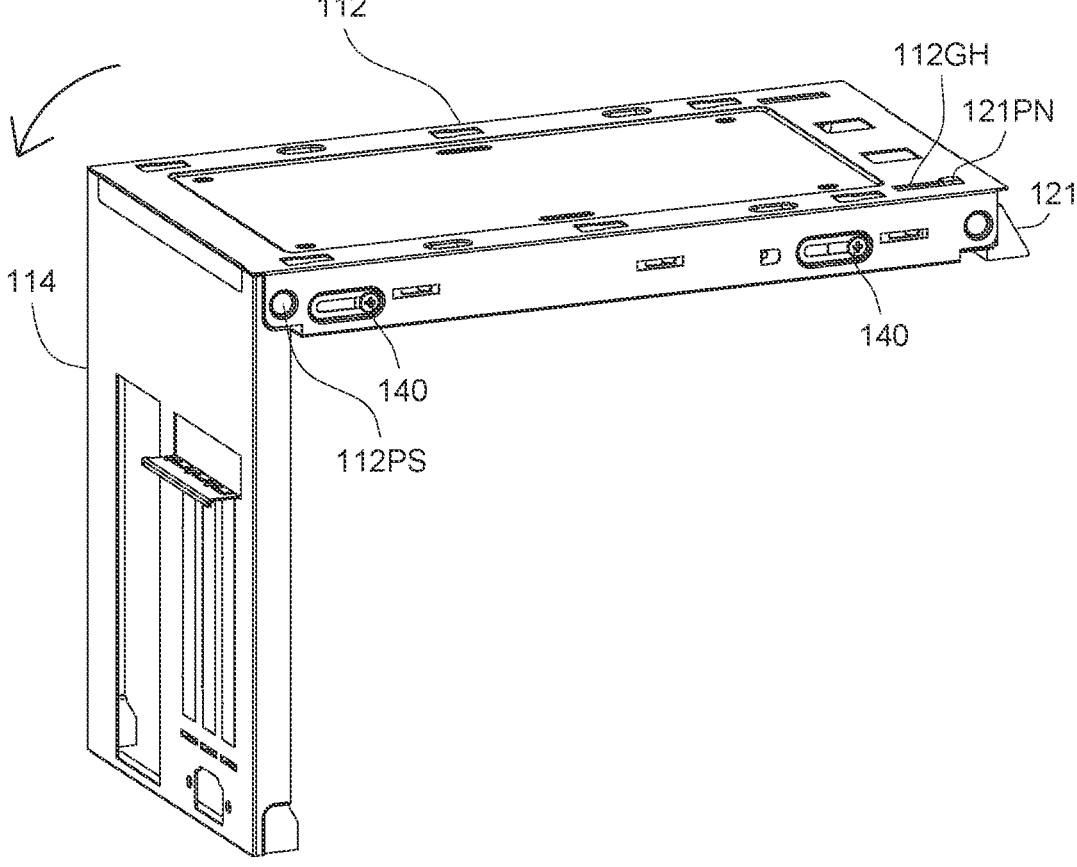
FIG. 6 is an assembly diagram of partial elements of a casing device according to an embodiment of the present disclosure.

Referring to FIG. 6, an assembly diagram of a top bracket 112, a back plate 114 and a slide rail assembly 120 of a casing device 100 is shown. The top bracket 112 may be provided with a positioning shaft structure 112PS. The top bracket 112 is connected to the back plate 114 through the positioning shaft structure 112PS. That is, the back plate 114 may be provided with a groove structure corresponding to the positioning shaft structure 112PS to form a pivotal matching. When the slide rail assembly 120 moves from the first position to second position, the protrusion 121PN moves in the guide slot 112GH, such that the top bracket 112 can rotate around the positioning shaft structure 112PS with respect to the back plate 114 to be detached from the back plate 114. To put it in greater details, after the slide rail assembly 120 moves from the first position to the second position, the protrusion 121PN of the slide component 121 also moves in the guide slot 112GH. Thus, a snap hook structure of the protrusion 121PN can release the fastening with the top bracket 112, such that the top bracket 112 can rotate around the positioning shaft structure 112PS to be detached from the back plate 114, and the top bracket 112 can be detached from the casing device 100.

According to the casing device disposed in the embodiments of the present disclosure, the casing body is provided with a slide rail assembly movable between different positions, such that a user can toollessly assemble or detach the side panel of the casing body, not only saving labor but also providing more convenience. According to the casing device disclosed in the embodiments of the present disclosure, the top bracket of the casing body may be detached by using the same movable slide rail assembly, such that the cost can be reduced.

While the invention has been described by way of example and in terms of the preferred embodiment(s), it is to be understood that the invention is not limited thereto. Based on the technical features embodiments of the present invention, a person ordinarily skilled in the art will be able to make various modifications and similar arrangements and procedures without breaching the spirit and scope of protection of the invention. Therefore, the scope of protection of the present invention should be accorded with what is defined in the appended claims.

What is claimed is:

1. A casing device, comprising:

a casing body including a side panel and a top bracket, wherein the top bracket has a guide slot; and a slide rail assembly movably arranged on the casing body, wherein the slide rail assembly comprises a slide component and a slide rail fixed with each other, and the slide component has a protrusion arranged in the guide slot;

wherein, when the slide rail assembly is in a first position, the side panel is fastened to the top bracket and the slide rail, and when the slide rail assembly moves from the first position to a second position, the side panel is able to be detached from the top bracket and the slide rail.

2. The casing device according to claim 1, wherein the side panel has a hook portion, when the slide rail assembly is in the first position, the hook portion passes through the top bracket and the slide rail to be engaged in the slide rail.

3. The casing device according to claim 1, further comprising:

an elastic element connected between the slide rail and the top bracket, wherein when the side panel is detached from the top bracket and the slide rail, the elastic element provides an elastic force for returning the slide rail assembly from the second position to the first position.

4. The casing device according to claim 3, wherein the elastic element is an extension spring.

5. The casing device according to claim 1, further comprising a guide bolt, wherein the guide bolt passes through the top bracket and the slide rail and is locked on the slide rail, and when the slide rail assembly moves from the first position to the second position, the slide rail and the guide bolt are moveable with respect to the top bracket.

6. The casing device according to claim 1, wherein the slide component is locked on the slide rail.

7. The casing device according to claim 1, wherein the slide component has an inclined plane structure, which provides the slide component with a position for bearing a longitudinal force.

8. The casing device according to claim 7, wherein the casing body comprises a front plate, the slide component passes through the front plate, and the inclined plane structure is exposed from the front plate.

9. The casing device according to claim 1, wherein the casing body comprises a back plate, the top bracket has a positioning shaft structure through which the top bracket is connected to the back plate, and when the slide rail assembly moves from the first position to the second position, the protrusion moves in the guide slot, such that the top bracket is able to rotate around the positioning shaft structure with respect to the back plate to be detached from the back plate.

* * * * *